(12) United States Patent
Kho et al.

(10) Patent No.: US 8,120,020 B2
(45) Date of Patent: Feb. 21, 2012

(54) ORGANIC LIGHT EMITTING DEVICE

(75) Inventors: Sam-Il Kho, Yongin (KR); Dong-Seob Jeong, Yongin (KR); Jae-Young Cho, Yongin (KR); Sung-Woo Cho, Yongin (KR); Min-Chul Suh, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 9 days.

(21) Appl. No.: 12/621,418

(22) Filed: Nov. 18, 2009

(65) Prior Publication Data

US 2010/0163854 A1 Jul. 1, 2010

(30) Foreign Application Priority Data

Dec. 26, 2008 (KR) .................. 10-2008-0134984

(51) Int. Cl.
*H01L 51/52* (2006.01)
(52) U.S. Cl. .............. 257/40; 257/59; 257/79; 257/103; 257/E51.022; 257/E51.043
(58) Field of Classification Search .......... 257/40, 257/59, 79, 103, E51.022, E51.043
See application file for complete search history.

(56) References Cited

U.S. PATENT DOCUMENTS

| | | |
|---|---|---|
| 2004/0137270 A1 | 7/2004 | Seo et al. |
| 2005/0100760 A1* | 5/2005 | Yokoyama .................. 428/690 |
| 2005/0212407 A1 | 9/2005 | Matsusue |
| 2008/0268282 A1 | 10/2008 | Spindler et al. |
| 2008/0284319 A1 | 11/2008 | Lee et al. |
| 2009/0045739 A1 | 2/2009 | Kho et al. |

FOREIGN PATENT DOCUMENTS

| | | |
|---|---|---|
| EP | 1 811 586 A | 7/2007 |
| JP | 10-116687 | 5/1998 |
| JP | 11-260562 | 9/1999 |
| JP | 2000-003787 | 1/2000 |
| JP | 2001-291581 | 10/2001 |
| JP | 2005-310746 | 11/2005 |
| JP | 2007-27779 | 2/2007 |
| JP | 2007-194213 | 8/2007 |
| JP | 2008-091069 | 4/2008 |
| KR | 1020060065123 A | 6/2006 |
| KR | 1020070060196 A | 6/2007 |
| KR | 10-2008-0088208 | 10/2008 |
| KR | 10-2009-0017859 | 2/2009 |
| WO | WO 2006/095553 A1 | 9/2006 |

OTHER PUBLICATIONS

Japanese Office action dated Jul. 12, 2011, for corresponding Japanese Patent application 2009-290946, 2 pages.
KIPO Notice of Allowance dated Sep. 21, 2011, for Korean Priority Patent Application No. 10-2008-0134984, 5 pages.
EPO Search Report dated Nov. 2, 2011, for corresponding European Patent Application No. 09252745.6, listing the cited references, as well as JP 2008-091069 A which was cited in an IDS on Oct. 3, 2011, 8 pages.

* cited by examiner

*Primary Examiner* — Long Pham
(74) *Attorney, Agent, or Firm* — Christie, Parker & Hale, LLP

(57) ABSTRACT

An organic light emitting device (OLED) including: a substrate; a first electrode; a second electrode facing the first electrode; a first blue light emitting layer, a green light emitting layer, a red light emitting layer, and a second blue light emitting layer all interposed between the first electrode and the second electrode; and a color filter disposed in a path of light emitted from the light emitting layers, wherein the first blue light emitting layer includes a deep blue dopant, and the second blue light emitting layer includes a sky blue dopant.

19 Claims, 11 Drawing Sheets

ORGANIC LIGHT EMITTING DEVICE

CROSS-REFERENCE TO RELATED APPLICATION

This application claims the benefit of Korean Patent Application No. 10-2008-0134984, filed on Dec. 26, 2008, in the Korean Intellectual Property Office, the entire content of which is incorporated herein by reference.

BACKGROUND OF THE INVENTION

1. Field of the Invention

One or more embodiments of the present invention relate to an organic light emitting device.

2. Description of the Related Art

Organic light emitting devices (OLEDs), which are self-emitting devices, have wide viewing angles, high contrast, and quick response time, and thus have drawn a large amount of public attention. Furthermore, OLEDs have a low operating voltage and can realize multi colored images. Thus, a lot of research into organic emitting devices has been carried out.

When current is supplied to an anode and a cathode respectively formed on both sides of an emitting layer, electrons and holes recombine in the emissive layer and thus light is emitted. In general, an OLED may include an organic layer having a multi-layered structure including hole injection layer (HIL), hole transport layer (HTL), an electron transport layer (ETL), and/or electron injection layer (EIL) formed on either end of the emitting layer in order to obtain excellent light emitting properties.

A single color OLED has an anode/emitting layer/cathode structure. The OLED may emit a variety of colors according to the types of materials forming the emitting layer. A method of stacking materials emitting red, green, and blue light, which are the three primary light colors, may be used to prepare a white light emitting OLED.

However, the blue light emitting efficiency of such a white light emitting OLED is too low.

The blue light emission is closely related to the color coordinate, color reproduction ratios, and lifetime (or lifespan) of the OLED.

However, the color coordinate, color reproduction ratios, and lifetime of existing OLEDs are not satisfactory, and thus there is a need to improve these properties.

SUMMARY OF THE INVENTION

Aspects of one or more embodiments of the present invention are directed toward an organic light emitting device (OLED) having excellent color coordinate, color reproduction ratios, and lifetime by efficiently controlling the composition of a blue emitting layer among a plurality of emitting layers of the OLED.

Additional aspects will be set forth in part in the description which follows and, in part, will be apparent from the description, or may be learned by practice of the presented embodiments.

According to an embodiment of the present invention, an organic light emitting device (OLED) includes a substrate; a first electrode on the first substrate; a second electrode facing the first electrode; a first blue emitting layer, a green emitting layer, a red emitting layer, and a second blue emitting layer all interposed between the first electrode and the second electrode; and a color filter disposed in a path of light emitted from the emitting layers, wherein the first blue emitting layer includes a deep blue dopant, and the second blue emitting layer includes a sky blue dopant.

The first blue emitting layer may further include a blue host, wherein the amount of the deep blue dopant is between about 2 and about 10 parts by weight based on 100 parts by weight of the blue host.

The second blue emitting layer may include a blue host, wherein the amount of the deep blue dopant is between about 2 and about 10 parts by weight based on 100 parts by weight of the blue host.

The first blue emitting layer, the green emitting layer, the red emitting layer, and the second blue emitting layer may be sequentially stacked between the first electrode and the second electrode.

The OLED may be a top-emission type OLED fabricated by coating the OLED with an encapsulation film and disposing the color filter on the encapsulation film.

The OLED may be a top-emission type OLED fabricated by further including an encapsulation substrate on the second electrode, wherein the color filter is disposed between the second electrode and the encapsulation substrate, or on a surface of the encapsulation substrate which is not in contact with the second electrode.

The OLED may be a bottom-emission type OLED fabricated by interposing the color filter between the substrate and the first electrode.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
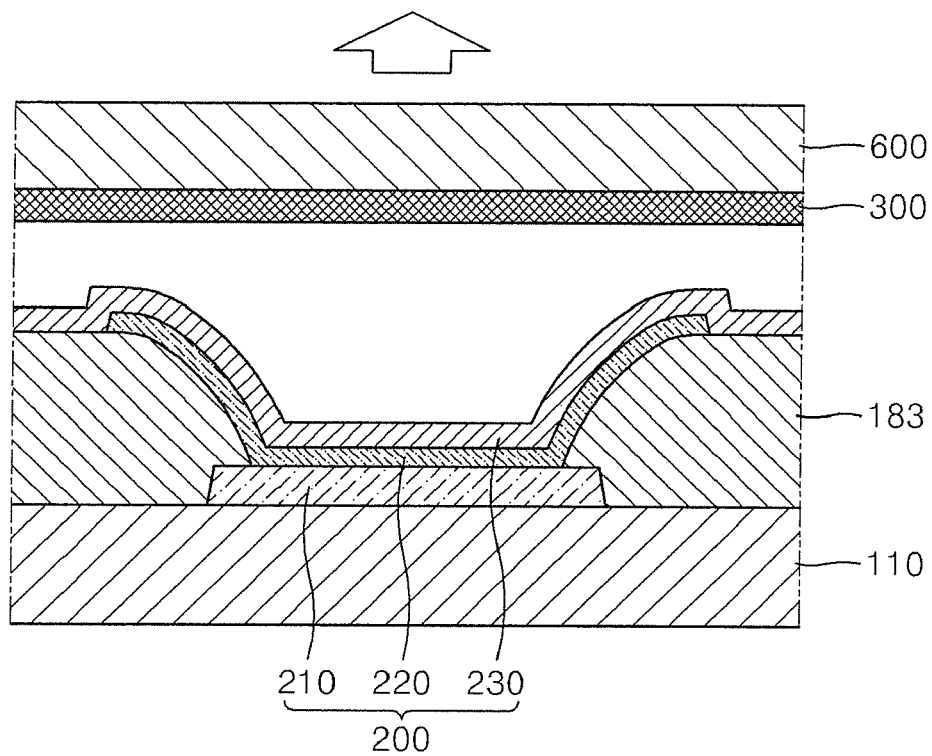
FIG. 1A illustrates a schematic cross-sectional view of a passive matrix OLED device according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

An organic light emitting device (OLED) according to an embodiment of the present invention is a white OLED including: a first blue light emitting layer, a green light emitting layer, a red light emitting layer, and a second blue light emitting layer between a first electrode and a second electrode facing the first electrode; and a color filter disposed in a path of light emitted from the light emitting layers. Here, the first blue light emitting layer includes a deep blue dopant, and the second blue light emitting layer includes a sky blue dopant.

In the organic light emitting device, the green light emitting layer may not be in contact with the second blue light emitting layer so that interaction between blue and green is reduced to increase blue color reproduction ratios and efficiencies. That is, the first blue light emitting layer, the green light emitting layer, the red light emitting layer, and the second blue light emitting layer may be sequentially stacked.

The first blue light emitting layer includes a blue host and a deep blue dopant. Here, the amount of the deep blue dopant may be between 2 and 10 parts by weight based on 100 parts by weight of the blue host. In one embodiment, if the amount of the deep blue dopant is within the range described above, charge balance can be adjusted without deteriorating blue light emission.

The deep blue dopant is a material exhibiting a peak at a wavelength equal to or less than 460 nm, and may be 4'-N,N-diphenylaminostyryl-triphenyl (DPA-TP), 2,5,2',5'-tetrastyryl-biphenyl (TSB), an anthracene derivative, and/or diphenyl-4-2-(1,1-; 4,1-terphenyl-4-yl-vinyl-phenyl) amine.

The second blue light emitting layer may include a blue host and a sky blue dopant. Here, the amount of the sky blue dopant may be between 2 and 10 parts by weight based on 100 parts by weight of the blue host. In one embodiment, if the amount of the sky blue dopant is within the range described above, excellent color coordinates characteristics can be obtained without deteriorating light emission.

The sky blue dopant is a material exhibiting a peak at a wavelength equal to or greater than 470 nm, and may be a di(styryl)-amine-based blue dopant such as p-bis(p-N,N-diphenyl-aminostyryl)benzene (DSA-Ph}, and/or phenyl cyclopentadiene.

The blue host is 4,4'-N,N'-dicarbazole-biphenyl (CBP), or di-styryl amine.

By concurrently (or simultaneously) using the first blue light emitting layer and the second blue light emitting layer, lifetime (or lifespan) and efficiency of blue emission may be significantly increased. In addition, the color reproduction ratios may be increased by decreasing interaction between the blue and green colors. Furthermore, charge may be accumulated by forming two blue light emitting layers having a large energy gap at both ends of the light emitting layer. Thus, in a white OLED having a plurality of light emitting layers, color reproduction ratios, lifetime, and efficiency may be improved.

The thickness of the first blue light emitting layer may be between about 5 and about 10 nm, and the thickness of the second blue light emitting layer may be between about 5 and about 7 nm.

In one embodiment, if the thicknesses of the first blue light emitting layer and the second blue light emitting layer are within the range described above, excellent color coordinate characteristics can be obtained without deteriorating light emission.

In the OLED according to an embodiment of the present invention, the thickness of the red light emitting layer may be between about 10 and about 25 nm, and the thickness of the green light emitting layer may be between about 4 and about 9 nm.

A hole injection layer (HIL) and/or a hole transport layer (HTL) may further be formed between the first electrode and the first blue light emitting layer.

An electron transport layer (ETL) may be formed between the second blue light emitting layer and the second electrode, and an EIL may be formed between the ETL and the second electrode. If desired, a hole blocking layer (HBL) may further be formed between the second blue light emitting layer and the ETL.

Also, if the OLED is a bottom-emission type OLED, the substrate may be, for example, a glass substrate.

The OLED according to an embodiment of the present invention may be used in a variety of flat display devices, such as passive matrix (PM) organic light emitting display devices and active matrix (AM) organic light emitting display devices. In particular, if the OLED is used in an AM organic light emitting display device, the first electrode, constituting a pixel electrode, disposed on the substrate may be electrically connected to a source electrode or a drain electrode of a thin-film transistor. In addition, the OLED may also be used in a dual emission type flat display device.

FIG. 1A is a schematic cross-sectional view of a passive matrix OLED device according to an embodiment of the present invention. Referring to FIG. 1A, the OLED device according to the present embodiment includes a substrate 110. The substrate 110 may be formed of various suitable materials such as glass, metal, and/or plastic. The substrate 110 includes a display region in which display devices for reproducing images are arranged. The display region includes an OLED 200 including a pixel electrode 210 (or first electrode), a counter electrode 230 (or second electrode) facing the pixel electrode 210, and an organic layer 220 interposed between the pixel electrode 210 and the counter electrode 230. The organic layer 220 has a structure including a first blue light emitting layer, a green light emitting layer, a red light emitting layer, and a second blue light emitting layer, which are sequentially stacked.

The organic layer 220 may also include a HIL and/or a HTL interposed between the pixel electrode 210 and a first blue light emitting layer EML1, or an ETL and/or an EIL may be interposed between a second blue light emitting layer EML2, and the counter electrode 230, if desired.

Figure 1B:
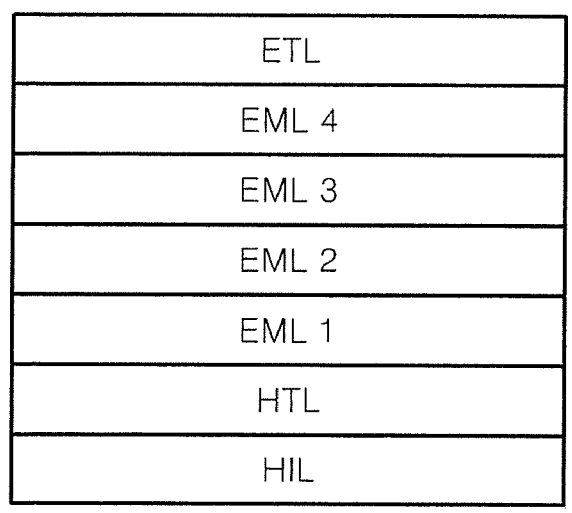
FIG. 1B illustrates a schematic structure of organic layers of an OLED according to an embodiment of the present invention.

FIG. 1B illustrates a schematic structure of the organic layer 220 according to an embodiment of the present invention. Referring to FIG. 1B, the organic layer 220 has a structure in which the HIL and the HTL are sequentially formed on the pixel electrode 210, and the first blue light emitting layer EML1, a green light emitting layer EML2, a red light emitting layer EML3, a second blue light emitting layer EML4, and the ETL are sequentially stacked on the HTL.

The HIL may be formed of a phthalocyanine compound, such as copperphthalocyanine disclosed in U.S. Pat. No. 4,356,429, the entire content of which is incorporated herein by reference; a star-burst type amine derivative, such as TCTA, m-MTDATA, and m-MTDAPB, disclosed in Advanced Material, 6, p. 677 (1994), the entire content of which is incorporated herein by reference; or the like.

The HTL may be formed of N,N'-bis(3-methylphenyl)-N,N'-diphenyl-[1,1-biphenyl]-4,4'-diamine (TPD), N,N'-di (naphthalene-1-yl)-N,N'-diphenyl benzidine (α-NPD), or the like.

The ETL may be formed of bis(10-hydroxybenzo[h]quinolinato)beryllium (Bebq2), a derivative thereof, Alq$_3$, or the like.

In one embodiment, a sealant is applied to the margin of the substrate 110 so that a sealing member 600 covers the display region. The structure of the OLED may be modified in a variety of suitable ways. For example, the sealant and the sealing member 600 may not be used, or a passivation layer may be applied to the top surface of the substrate 110. If the OLED is a top-emission type OLED, the sealing member 600 may be formed of glass. In this regard, the sealing member 600 may be coated with a color filter 300. That is, the color filter 300 may be disposed so as to contact one of the surfaces of the sealing member 600.

Figure 1C:
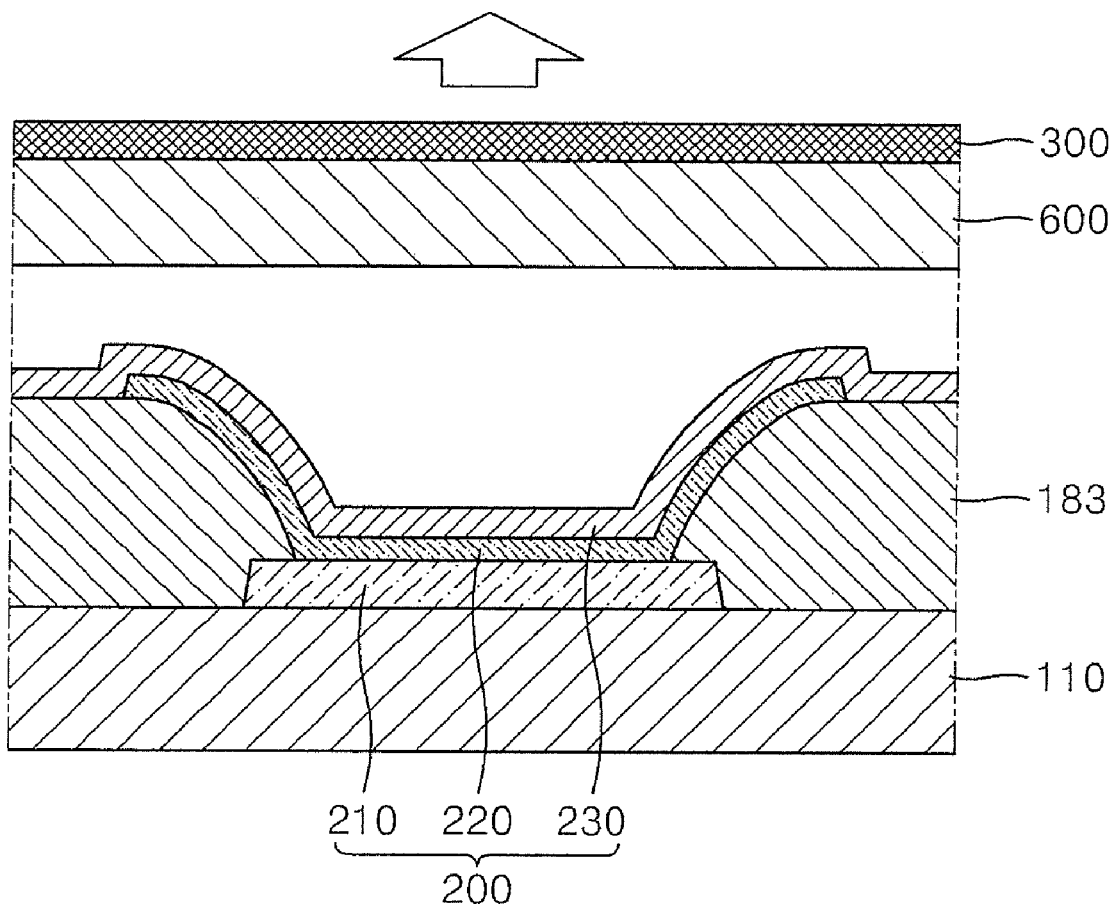
FIG. 1C illustrates a schematic cross-sectional view of a passive matrix OLED device according to another embodiment of the present invention.

FIGS. 1A and 1C illustrate schematic cross-sectional views of top-emission type passive matrix OLED devices, in which a color filter 300 is formed on the top and bottom surfaces of the sealing member 600, respectively.

Figure 2A:
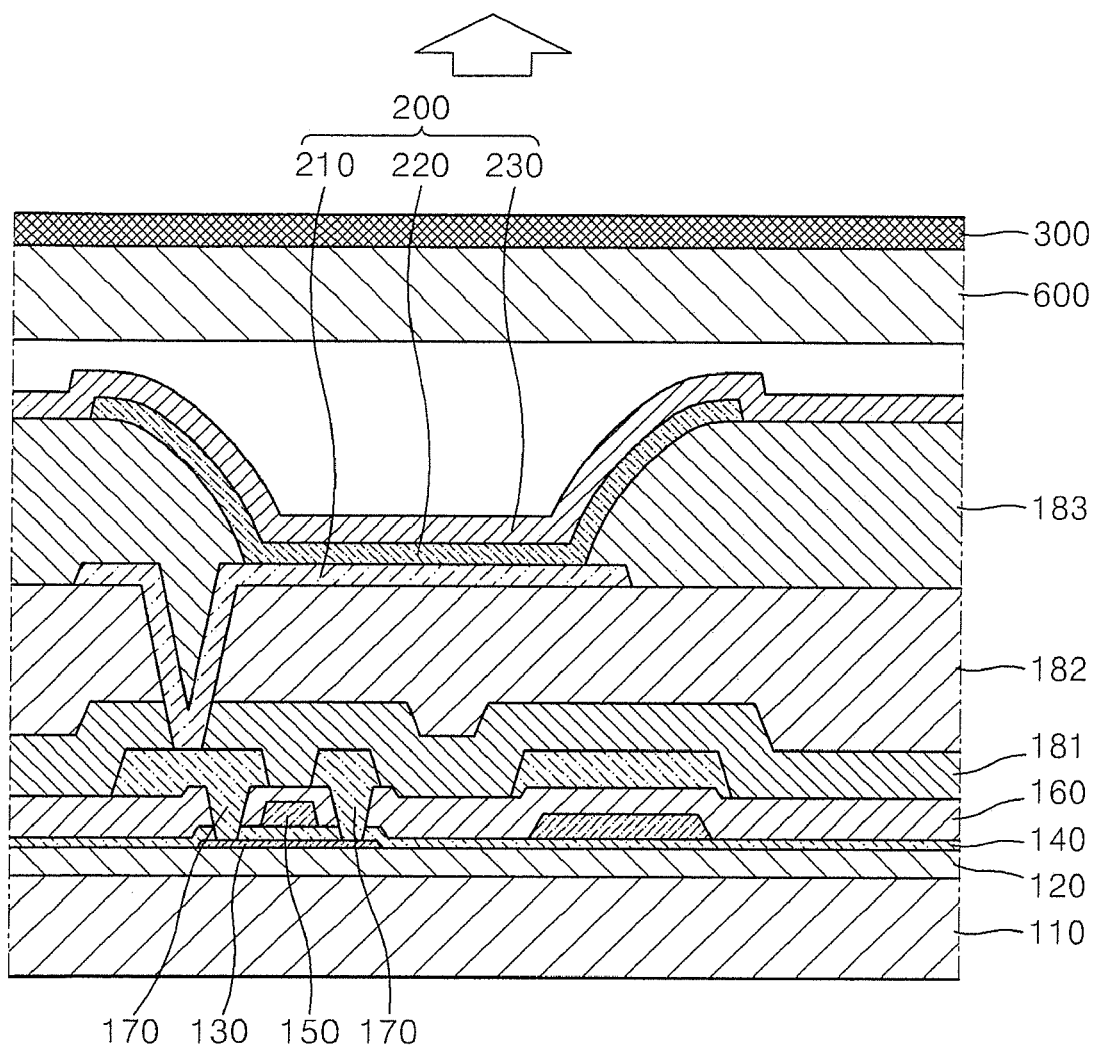
FIGS. 2A and 2B illustrate schematic cross-sectional views of top-emission type active matrix OLED devices according to embodiments of the present invention.
Figure 2B:
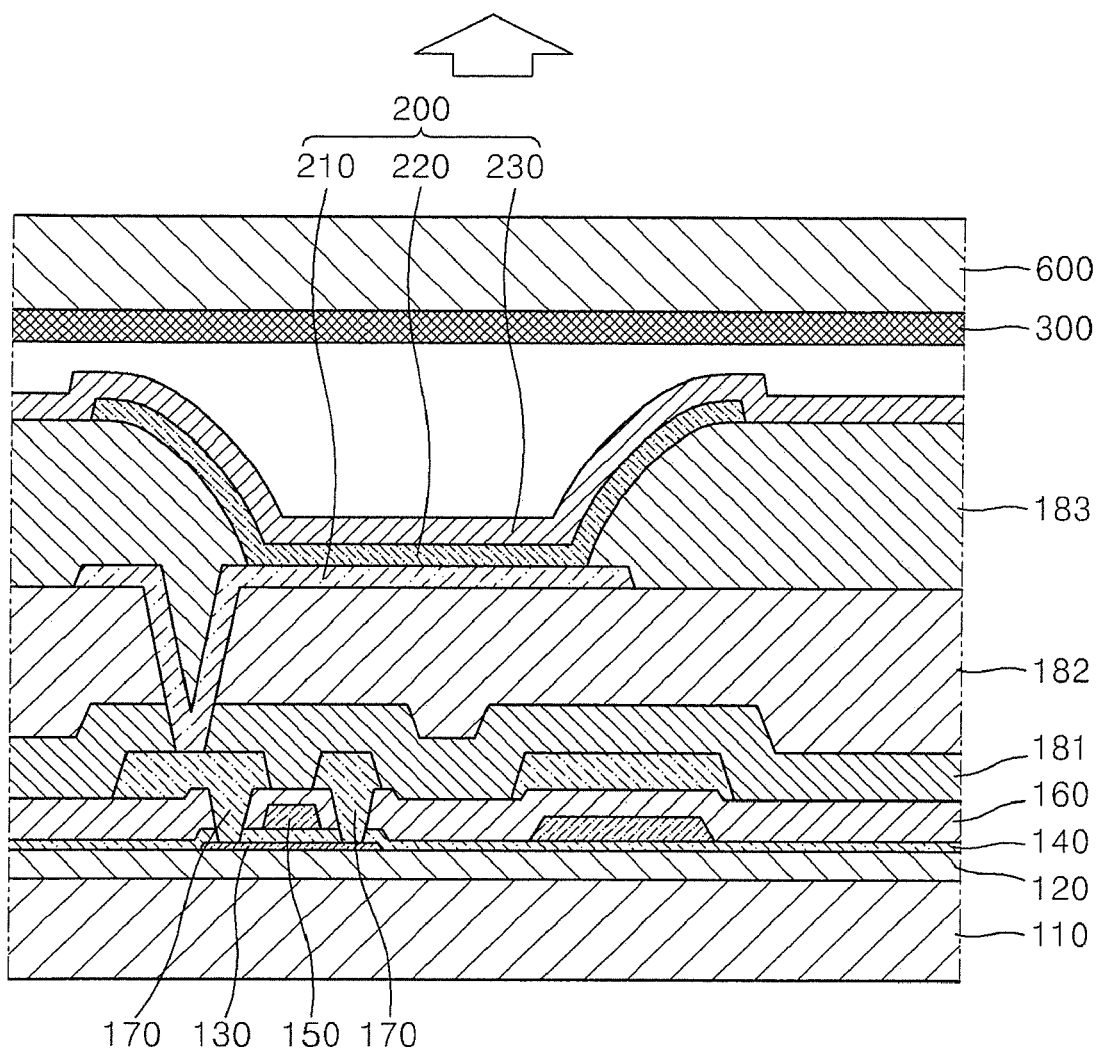

FIGS. 2A and 2B illustrate schematic cross-sectional views of top-emission type active matrix OLED devices, in which a color filter 300 is formed on the top and bottom surfaces of the sealing member 600, respectively.

Figure 3A:
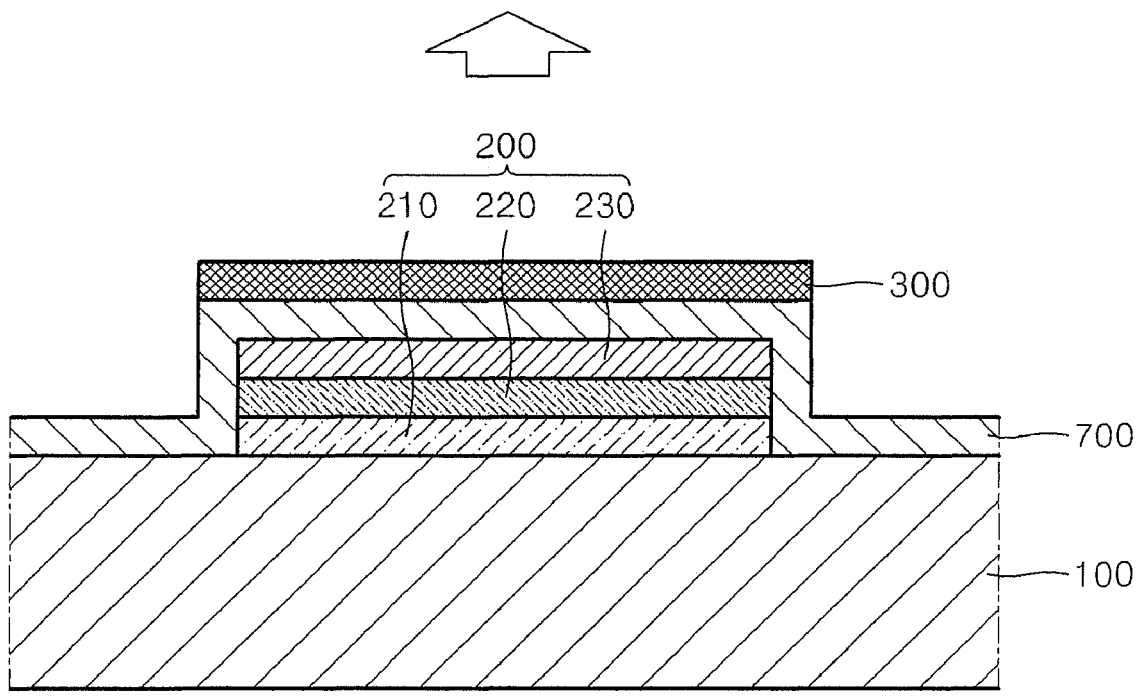
FIGS. 3A and 3B respectively illustrate schematic cross-sectional views of passive and active matrix OLED devices according to embodiments of the present invention.
Figure 3B:
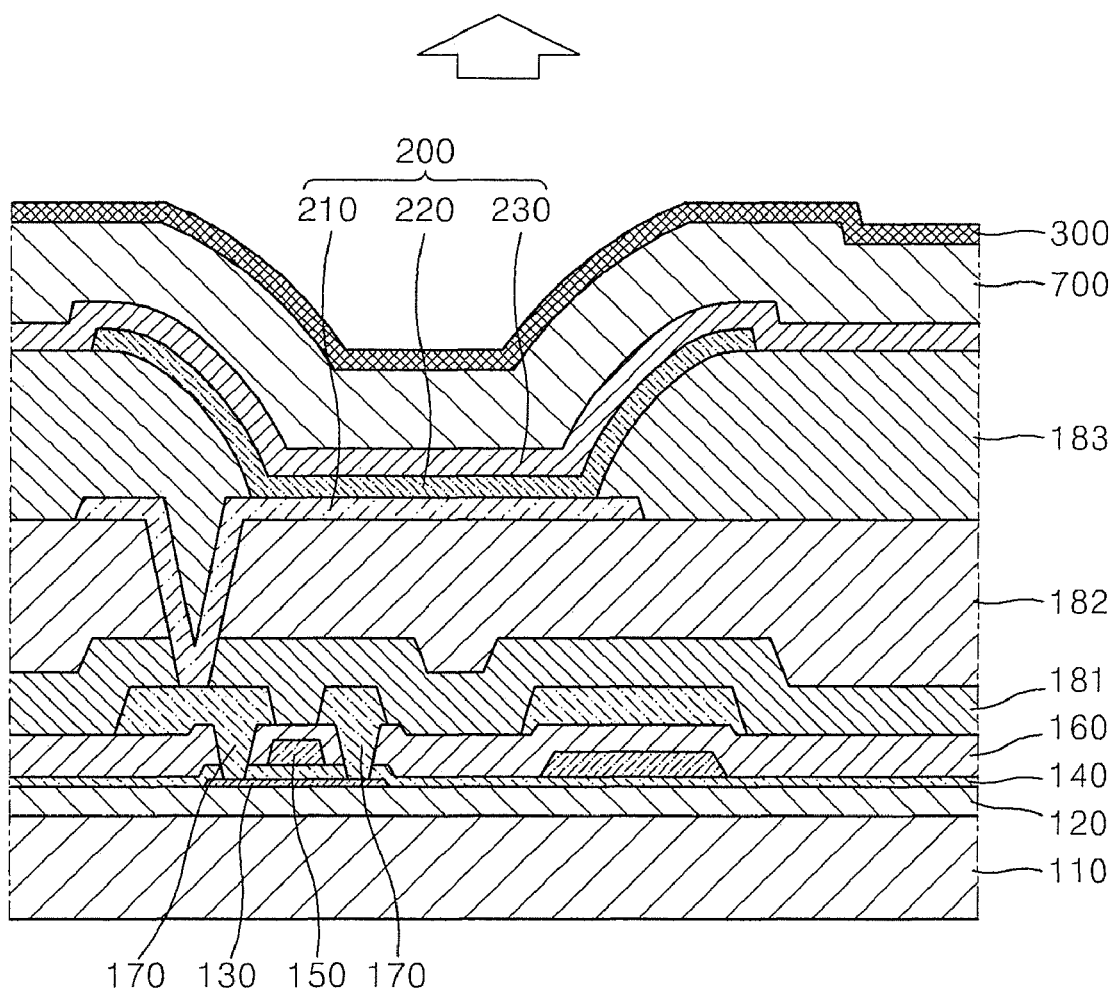

In addition, the color filter 300 may be formed on the top surface of the sealing member 600, and the encapsulation film 700 (See FIGS. 3A and 3B) may cover the OLED 200 instead of the sealing member 600. Since the OLED 200 is easily deteriorated by moisture or oxygen, an encapsulation film 700 is disposed so as to cover the OLED 200 as described above. The encapsulation film 700 may be formed of an organic or inorganic material. FIG. 3A illustrates a cross-sectional view of a passive matrix OLED device, and FIG. 3B illustrates a cross-sectional view of an active matrix OLED device, in which the encapsulation film 700 covers the OLED 200 and the color filter 300 is formed thereon, according to embodiments of the present invention.

The color filter 300 may be formed of suitable material(s) and using suitable method(s).

Referring to FIG. 2A, the display region and the OLED 200 will be described in more detail.

A thin-film transistor (TFT) is disposed in a display region of a substrate 110. First, a buffer layer 120 formed of SiO$_2$, or the like is formed on the substrate 110. A semiconductor layer 130, which may be an amorphous silicon layer or polycrystalline silicon layer formed of an organic semiconductor material, is formed on the buffer layer 120.

Although not illustrated in FIG. 2A, the semiconductor layer 130 may include a source region doped with a dopant, a drain region, and a channel region.

A gate electrode 150 is formed on the semiconductor layer 130. According to a signal applied to the gate electrode 150, a source electrode and a drain electrode 170 electrically communicate with each other. The gate electrode 150 may be formed of, for example, MoW, Ag, Cu, or Al in consideration of adhesion to adjacent layers, surface planarity of the layers, and/or processability. In one embodiment, in order to secure insulation properties between the semiconductor layer 130 and the gate electrode 150, a gate insulating layer 140 formed of SiO$_2$, and/or the like may be interposed between the semiconductor layer 130 and the gate electrode 150.

An interlayer insulating layer 160, which is formed of a silicon oxide or a silicon nitride in a single or multi-layer layer structure, is formed on the gate electrode 150. The source and drain electrodes 170 are formed on the interlayer insulating layer 160. The source and drain electrodes 170 are connected to the semiconductor layer 130 via contact holes respectively formed in the interlayer insulating layer 160 and the gate insulating layer 140. The source and drain electrodes 170 may be formed of Ti, MoW, Ag, Co, Al, or the like in consideration of conductivity. The source and drain electrodes 170 may have a single or multi-layer structure. For example, the source and drain electrodes 170 may have a multi-layer structure such as a Ti—Al—Ti structure.

A first insulating layer 181, constituting a passivation layer, is formed on the TFT to protect the TFT. The passivation layer 181 may be formed of various suitable materials, for example, an inorganic material offering excellent protection, such as a silicon oxide, a silicon nitride, and/or a siliconoxy nitride. Even though the source and drain electrodes 170 are illustrated as having a single layer structure in FIG. 2A, they may also have a multi-layer structure, and the structure thereof may be modified in various suitable ways.

A second insulating layer 182, constituting a planarization layer, is formed on the first insulating layer 181. That is, the second insulating layer 182 has a flat top surface although it is formed on the TFT. For the planarization purposes, the second insulating layer 182 may be formed of an organic material, such as acryl, benzocyclobutene (BCB), and/or photoacryl. According to FIG. 2A, the second insulating layer 182 has a single layer structure. However, the second insulating layer 182 may also have a multi-layer structure, and the structure may be modified in various suitable ways.

Figure 5A:
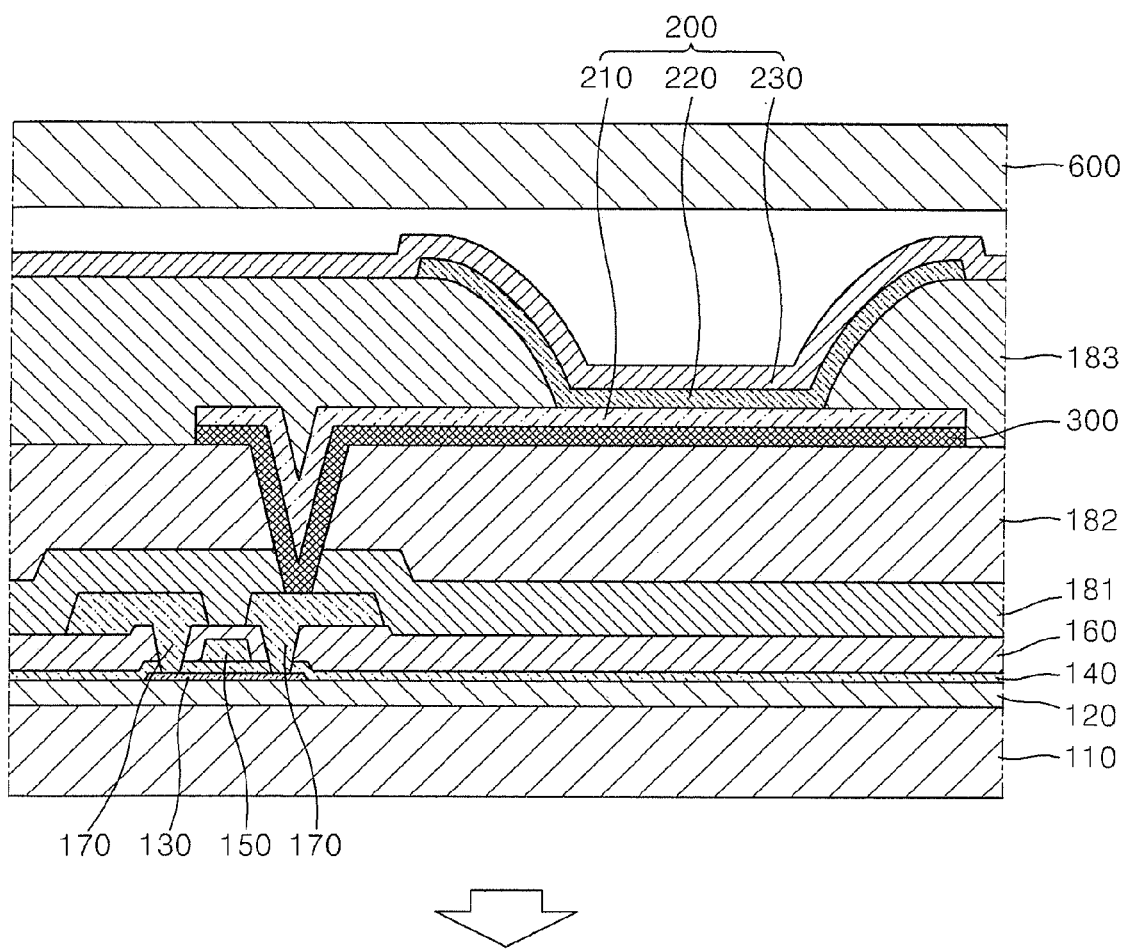
FIGS. 5A through 5C illustrate schematic cross-sectional views of bottom-emission type active matrix OLED devices according to embodiments of the present invention.
Figure 5B:
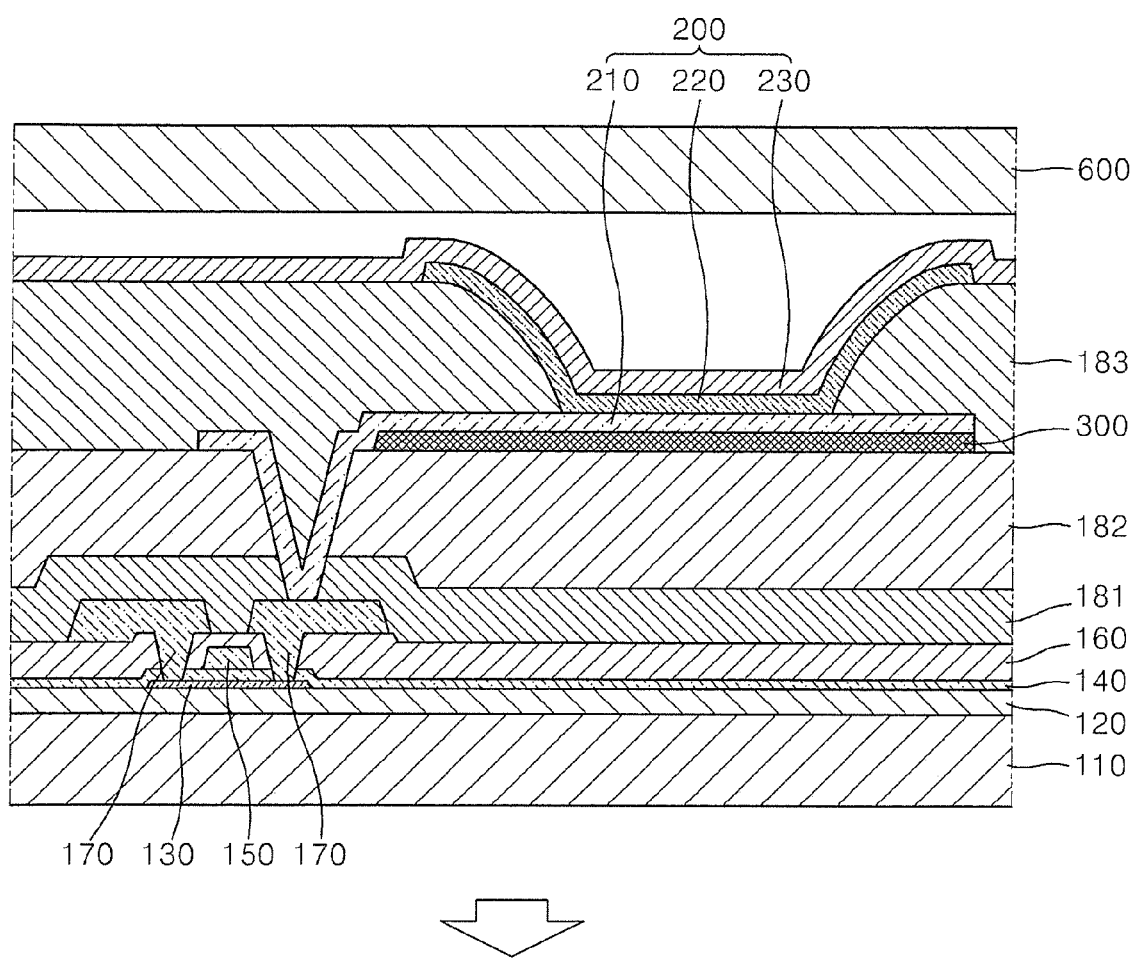
Figure 5C:
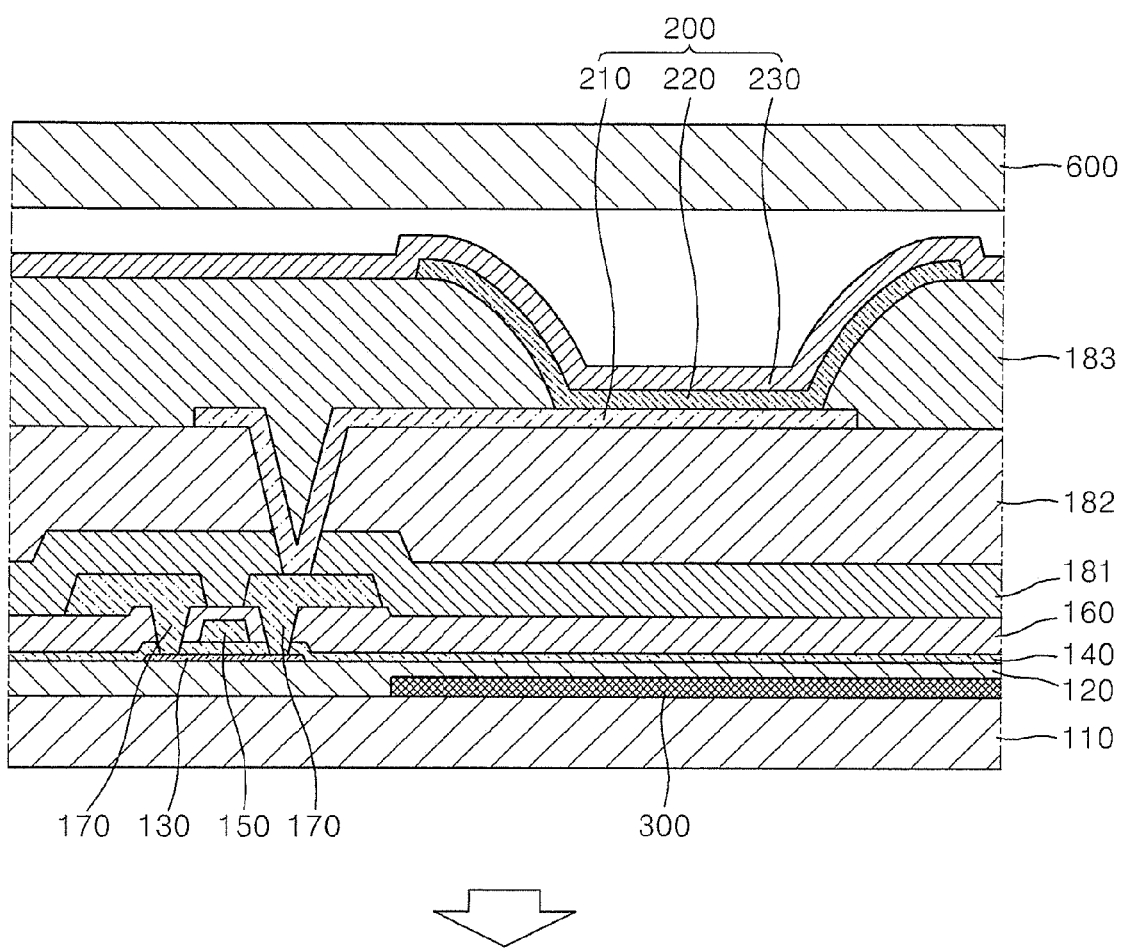

FIGS. 5A through 5C illustrate schematic cross-sectional views of bottom-emission type active matrix OLED devices according to embodiments of the present invention. Referring to FIGS. 5A and 5B, the bottom-emission type active matrix OLED devices include a color filter 300 disposed on the second insulating layer 182. Referring to FIG. 5C, the color filter 300 may also be formed on the substrate 110.

The color filter 300 may be formed on the substrate 110, the buffer layer 120, the gate insulating layer 140, the interlayer insulating layer 160, and the second insulating layer 181. The position of the color filter 300 may also be changed if the color filter 300 is disposed in the path of light.

Figure 4A:
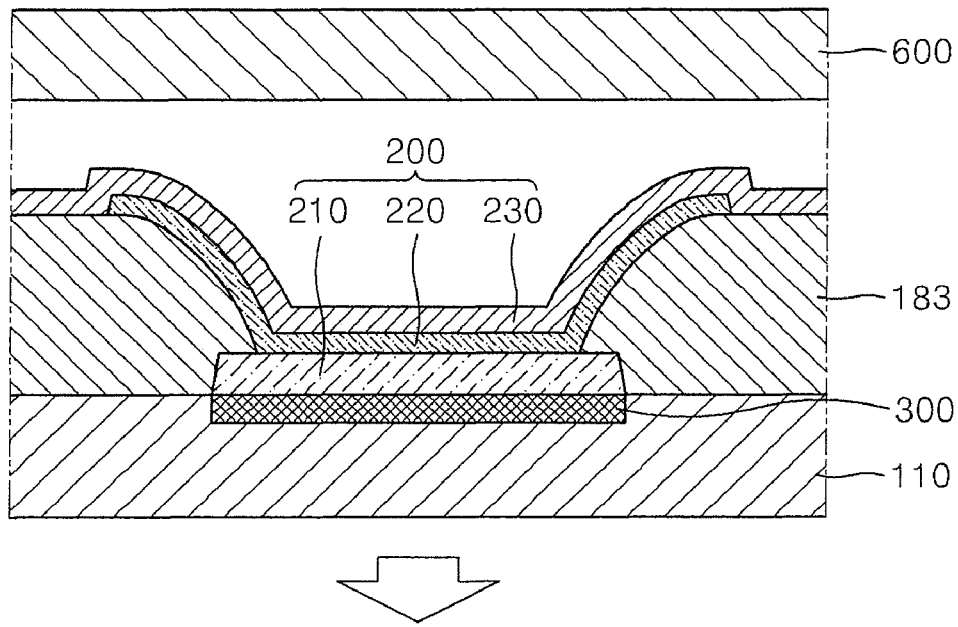
FIGS. 4A and 4B illustrate schematic cross-sectional views of bottom-emission type passive matrix OLED devices according to embodiments of the present invention.
Figure 4B:
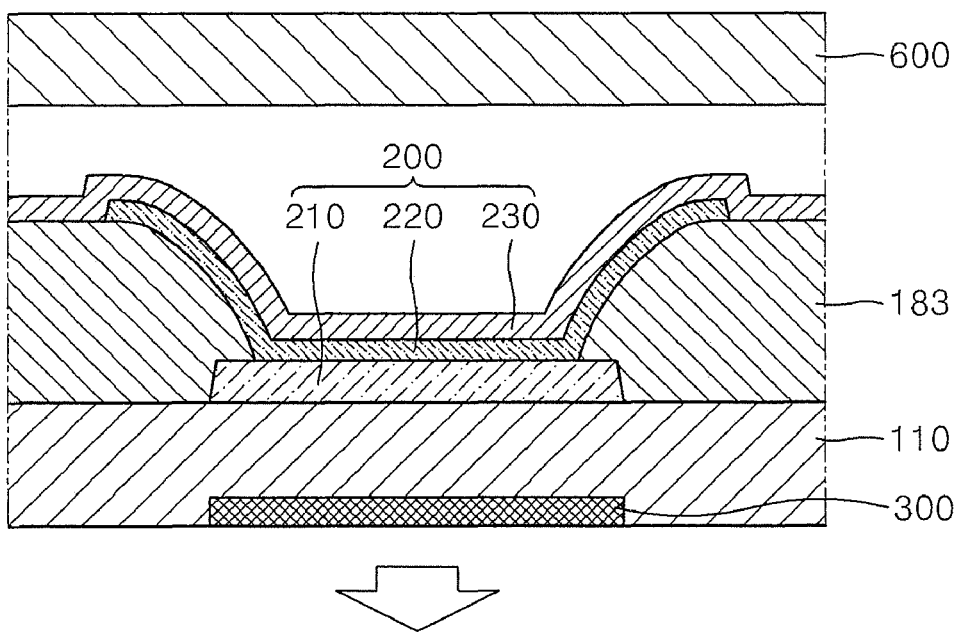

FIGS. 4A and 4B illustrate schematic cross-sectional views of bottom-emission type passive matrix OLED devices according to embodiments of the present invention. Referring to FIGS. 4A and 4B, the color filter 300 may be formed anywhere between the first electrode and the substrate 110 provided it is disposed in the path of light. Referring to FIGS. 4A and 4B, an OLED 200 including a pixel electrode 210, a counter electrode 230, and an organic layer 220 interposed between the pixel electrode 210 and the counter electrode 230 may be formed on the second insulating layer 182. This will be described in more detail. In the organic layer 220, a HIL and a HTL are sequentially formed, and a first blue light emitting layer EML1, a green light emitting layer EML2, a red light emitting layer EML3, a second blue light emitting layer EML4, and an ETL are sequentially stacked on the HTL.

An opening exposing at least one of the source and drain electrodes 170 of the TFT may be formed in the first insulating layer 181 and the second insulating layer 182 of the display region. The pixel electrode 210, which contacts one of the source and drain electrodes 170 so as to be electrically connected with the TFT through the opening, is formed in the display region of the substrate 110, particularly on the second insulating layer 182. The pixel electrode 210 may be a transparent or reflective electrode. If the pixel electrode 210 is a transparent electrode, ITO, IZO, ZnO, and/or $In_2O_3$ may be used to form the pixel electrode 210. If the pixel electrode 210 is a reflective electrode, it may include a reflective layer formed of Ag, Mg, Al, Pt, Pd, Au, Ni, Nd, Ir, Cr, and a compound thereof and another layer formed of ITO, IZO, ZnO, and/or $In_2O_3$.

Referring to FIGS. 2A, 2B, and 2C, a third insulating layer 183 is formed on the second insulating layer 182. That is, the third insulating layer 183 is formed so as to cover the second insulating layer 182. The third insulating layer 183 is a pixel defining layer which defines pixels by forming openings corresponding to sub pixels, i.e., forming openings so as to expose at least a portion, for example, the center, of the pixel electrode 210, or the entire pixel electrode 210. Referring to FIG. 2A, arc generation may be inhibited at the ends of the pixel electrode 210 by increasing the distance between the terminal of the pixel electrode 210 and the counter electrode 230 using the third insulating layer 183.

The organic layer 220 of the OLED 200 has a structure as described above.

The counter electrode 230 is disposed on the organic layer 220, i.e., in the display region. Referring to FIG. 2A, the counter electrode 230 may be formed so as to cover the display region. The counter electrode 230 is configured to extend out of the display region, to contact an electrode power supply line formed on the outside of the display region, and to receive an electrical signal from the electrode power supply line. That is, in one embodiment, the counter electrode 230 is extended out of the display region of the substrate 110 and formed on the electrode power supply line exposed by the third insulating layer 183 and the third insulating layer 183.

The counter electrode 230 may be a transparent or reflective electrode. If the counter electrode 230 is a transparent electrode, it may have a layer formed of a metal having a low work function, such as Li, Ca, LiF/Ca, LiF/Al, Al, Ag, Mg, and a compound thereof and a transparent conductive layer formed of ITO, IZO, ZnO, and/or $In_2O_3$. If the counter electrode 230 is a reflective electrode, Li, Ca, LiF/Ca, LiF/Al, Al, Ag, Mg, and a compound thereof may be used to form the counter electrode 230. The counter electrode 230 may also be formed of other suitable materials and have a single or multilayer structure.

Hereinafter, one or more embodiments of the present invention will be described in more detail with reference to the following examples. However, these examples are not intended to limit the purpose and scope of the present invention.

EXAMPLE 1

A Corning 15 Ω/cm² (1200 Å) ITO glass substrate was cut into pieces of 50 mm×50 mm×0.7 mm in size. Then, each of the pieces was cleaned by sonification in isopropyl alcohol and deionized water for 5 minutes, and then the pieces were exposed to ultraviolet rays and UV ozone cleaned for 10 minutes. The pieces of glass substrate were installed in a vacuum deposition device.

NPD was vacuum deposited on the substrate to form a HIL. TPD was deposited on the HIL to form a HTL. 4,4-N,N-dicarbazole-biphenyl, constituting a host, and diphenyl-4-2-(1,1-; 4,1-terphenyl-4-yl-vinyl-phenyl) amine, constituting a deep blue dopant, were deposited on the HTL to form a first blue light emitting layer having a thickness of 8 nm.

4,4-N,N-dicarbazole-biphenyl (CBP), constituting a host, and fac-tris-(2-phenylpyridinato-N,C2) iridium-III ($Ir(ppy)_3$), constituting a dopant, were deposited on the first blue light emitting layer to form a green light emitting layer having a thickness of 7 nm.

4,4-N,N-dicarbazole-biphenyl (CBP), constituting a host, and 4-(dicyanomethylene)-2-t-butyl-6-(1,1,7,7-tetramethyl-julolidyl-9-enyl)-4H-pyran (DCJTB) were deposited on the green light emitting layer to form a red light emitting layer having a thickness of 20 nm.

Di-styryl-amine, constituting a host, and p-bis-p-N,N-diphenylaminostyryl-benzene (DPAVBi), as a sky blue dopant, were deposited on the red light emitting layer to form a second blue light emitting layer having a thickness of 5 nm.

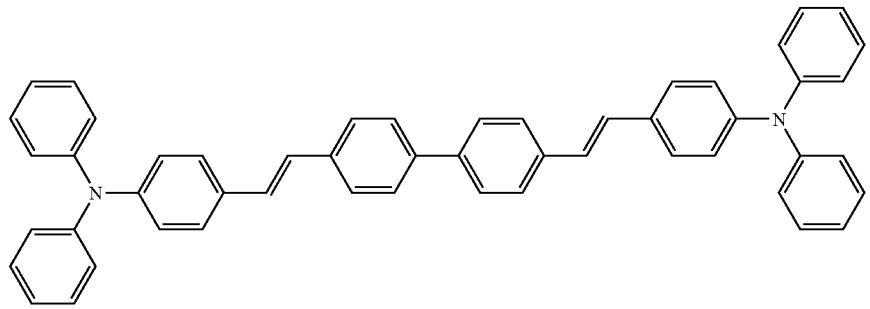

DPAVBi $Alq_3$ was vacuum deposited on the second blue light emitting layer to form an ETL, and Al was vacuum deposited on the ETL to a thickness of 120 nm to form a cathode, thereby completing the manufacture of an OLED.

COMPARATIVE EXAMPLE 1

An OLED was prepared in the same (or substantially the same) manner as in Example 1, except that the ETL was formed on the red light emitting layer without stacking the second blue light emitting layer on the red light emitting layer.

Blue light emitting efficiency, power efficiency, operating voltage, and color coordinate of the OLEDs prepared according to Example 1 and Comparative Example 1 were measured, and the results are shown in Table 1 below. In addition, EL emission spectra of the OLEDs of Example 1 and Comparative Example 1 are shown in FIG. 6.

TABLE 1

|  | Example 1 | Comparative Example 1 |
| --- | --- | --- |
| Operating voltage (V) | 5.79 | 6.06 |
| Current density (mA/cm$^2$) | 6.853 | 9.532 |
| Brightness (cd/m$^2$) | 1000 | 1000 |
| Emission efficiency (Cd/A) | 14.77 | 10.50 |
| Power efficiency (lm/W) | 8.05 | 5.45 |
| Color coordinate (x) | 0.32 | 0.30 |

Figure 6:
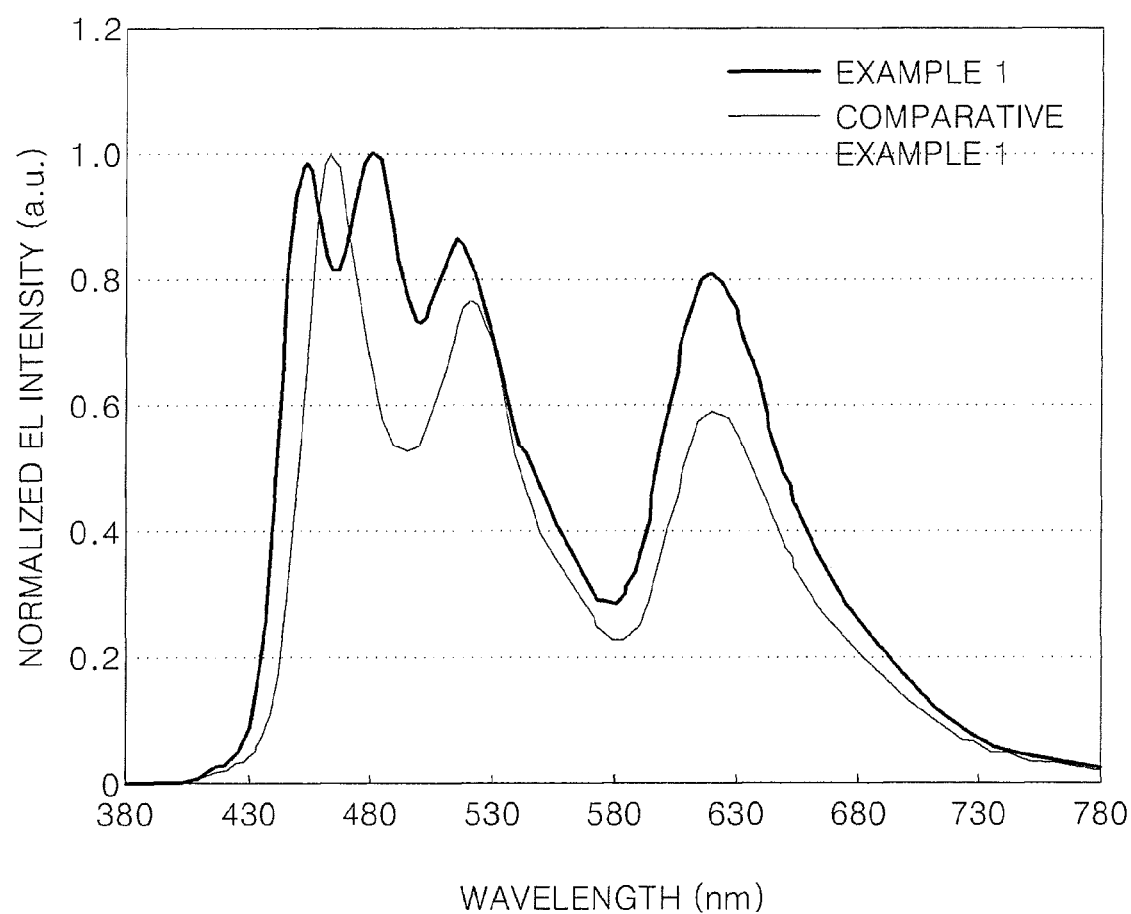
FIG. 6 is a graph illustrating electroluminescence (EL) intensities of OLEDs prepared according to Example 1 and Comparative Example 1.

Referring to FIG. 6 and Table 1, the blue light emitting efficiency, operating voltage, power efficiency, and color coordinate of the OLED prepared according to Example 1 were better than those of the OLED of Comparative Example 1.

As described above, according to the one or more of the above embodiments of the present invention, a white OLED having a plurality of light emitting layers with excellent color reproduction ratios, color coordinate, and lifetime may be obtained by increasing the blue light emitting efficiency.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting device (OLED) comprising:
   a substrate;
   a first electrode on the substrate;
   a second electrode facing the first electrode;
   a first blue light emitting layer, a green light emitting layer, a red light emitting layer, and a second blue light emitting layer all interposed between the first electrode and the second electrode; and
   a color filter disposed in a path of light emitted from the light emitting layers,
   wherein the first blue light emitting layer comprises a deep blue dopant, and
   the second blue light emitting layer comprises a sky blue dopant.

2. The OLED of claim 1, wherein the first blue light emitting layer further comprises a blue host, wherein the deep blue dopant is in an amount between about 2 and about 10 parts by weight based on 100 parts by weight of the blue host.

3. The OLED of claim 1, wherein the second blue light emitting layer further comprises a blue host, wherein the deep blue dopant is in an amount between about 2 and about 10 parts by weight based on 100 parts by weight of the blue host.

4. The OLED of claim 1, wherein the first blue light emitting layer, the green light emitting layer, the red light emitting layer, and the second blue light emitting layer are sequentially stacked between the first electrode and the second electrode.

5. The OLED of claim 1, wherein the deep blue dopant comprises 4'-N,N-diphenylaminostyryl-triphenyl (DPA-TP); 2,5,2',5'-tetrastyryl-biphenyl (TSB); an anthracene derivative; and/or diphenyl-4-2-(1,1-; 4,1-terphenyl-4-yl-vinyl-phenyl)amine.

6. The OLED of claim 1, wherein the sky blue dopant comprises p-bis(p-N,N'-diphenyl-aminostyryl)benzene and/or phenyl cyclopentadiene.

7. The OLED of claim 1, wherein the first blue light emitting layer has a thickness between about 5 and about 10 nm.

8. The OLED of claim 1, wherein the second blue light emitting layer has a thickness between about 5 and about 7 nm.

9. The OLED of claim 1, further comprising at least one of a hole injection layer or a hole transport layer between the first electrode and the first blue light emitting layer.

10. The OLED of claim 1, further comprising an electron transport layer and an electron injection layer between the second blue light emitting layer and the second electrode.

11. The OLED of claim 1, wherein the OLED is a top-emission type OLED, and the OLED is coated with an encapsulation film, and the color filter is on the encapsulation film.

12. The OLED of claim 1, wherein the OLED is a top-emission type OLED comprising an encapsulation substrate on the second electrode, and wherein the color filter is between the second electrode and the encapsulation substrate.

13. The OLED of claim 1, wherein the OLED is a top-emission type OLED comprising an encapsulation substrate on the second electrode, and wherein the color filter is on a surface of the encapsulation substrate not in contact with the second electrode.

14. The OLED of claim 1, wherein the OLED is a bottom-emission type OLED, and wherein the color filter is between the substrate and the first electrode.

15. An organic light emitting device (OLED) comprising:
   a first electrode;
   a first blue light emitting layer on the first electrode;
   a non-blue light emitting layer on the first blue emitting layer;
   a second blue light emitting layer on the non-blue light emitting layer;
   a second electrode on the second blue light emitting layer; and
   a color filter disposed in a path of light emitted from the light emitting layers,
   wherein the first blue light emitting layer comprises a deep blue dopant, and
   the second blue light emitting layer comprises a sky blue dopant.

16. The OLED of claim 15, wherein the non-blue light emitting layer comprises a green light emitting layer and a red light emitting layer.

17. An organic light emitting device (OLED) comprising:
   a first electrode;
   a deep blue light emitting layer on the first electrode;
   a green light emitting layer on the deep blue emitting layer;
   a red light emitting layer on the green light emitting layer;
   a sky blue light emitting layer on the red light emitting layer;
   a second electrode on the sky blue light emitting layer; and
   a color filter disposed in a path of light emitted from the light emitting layers.

18. The OLED of claim 1, wherein the sky blue dopant comprises a material exhibiting a peak at a wavelength equal to or greater than 470 nm.

19. The OLED of claim 1, further comprising an electron transport layer, wherein the first blue light emitting layer, the green light emitting layer, the red light emitting layer, the second blue light emitting layer, and the electron transport layer are sequentially stacked adjacent to one another.

* * * * *